United States Patent
Chen et al.

(10) Patent No.: US 9,647,088 B2
(45) Date of Patent: May 9, 2017

(54) MANUFACTURING METHOD OF LOW TEMPERATURE POLYSILICON THIN FILM TRANSISTOR

(71) Applicant: Shenzhen China Star Optoelectronics Technology Co., Ltd., Shenzhen, Guangdong (CN)

(72) Inventors: Gui Chen, Guangdong (CN); Jingfeng Xue, Guangdong (CN); Xin Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 143 days.

(21) Appl. No.: 14/425,052

(22) PCT Filed: Jan. 16, 2015

(86) PCT No.: PCT/CN2015/070890
§ 371 (c)(1),
(2) Date: Mar. 1, 2015

(87) PCT Pub. No.: WO2016/095306
PCT Pub. Date: Jun. 23, 2016

(65) Prior Publication Data
US 2016/0343829 A1    Nov. 24, 2016

(30) Foreign Application Priority Data

Dec. 16, 2014 (CN) .......................... 2014 1 0784059

(51) Int. Cl.
*H01L 21/00* (2006.01)
*H01L 21/84* (2006.01)
(Continued)

(52) U.S. Cl.
CPC .... *H01L 29/66757* (2013.01); *H01L 21/0273* (2013.01); *H01L 21/26513* (2013.01);
(Continued)

(58) Field of Classification Search
CPC ......... H01L 33/00; H01L 21/28; H01L 51/52; H01L 51/56; H01L 29/772; H01L 29/66;
(Continued)

(56) References Cited

U.S. PATENT DOCUMENTS

2010/0193790 A1* 8/2010 Yeo ..................... H01L 27/3248
257/59

* cited by examiner

*Primary Examiner* — Charles Garber
*Assistant Examiner* — Abdulfattah Mustapha
(74) *Attorney, Agent, or Firm* — Andrew C. Cheng

(57) ABSTRACT

The invention provides a manufacturing method of a low temperature polysilicon thin film transistor, including: providing a substrate; forming a buffer layer on the substrate; simultaneously forming a polysilicon layer and a photoresist layer on the buffer layer; implanting ions into a source region and a drain region; removing the photoresist layer; forming an insulating layer on the polysilicon layer; forming a gate electrode on the insulating layer; and forming a passivation layer on the insulating layer. The passivation layer covers the gate electrode. The invention can only use one time of mask process and one time of ion implantation process to complete the manufacturing processing of the polysilicon layer, the manufacturing process can be simplified and therefore the cost of process is reduced and the productivity is improved.

14 Claims, 4 Drawing Sheets

(51) Int. Cl.
  *H01L 29/66* (2006.01)
  *H01L 21/265* (2006.01)
  *H01L 29/08* (2006.01)
  *H01L 29/417* (2006.01)
  *H01L 21/027* (2006.01)
  *H01L 21/324* (2006.01)

(52) U.S. Cl.
  CPC ........ *H01L 21/324* (2013.01); *H01L 29/0847* (2013.01); *H01L 29/41733* (2013.01); *H01L 29/66492* (2013.01)

(58) Field of Classification Search
  CPC ....... H01L 21/283; H01L 21/84; H01L 51/50; G02F 1/1368; C30B 11/00
  See application file for complete search history.

MANUFACTURING METHOD OF LOW TEMPERATURE POLYSILICON THIN FILM TRANSISTOR

TECHNICAL FIELD

The invention relates to a manufacturing method of a low temperature polysilicon (LTPS) thin film transistor (TFT).

DESCRIPTION OF RELATED ART

Flat panel display devices have been booming with the evolution of optoelectronic and semiconductor technologies, and in many types of flat panel display devices, liquid crystal display (LCD) devices have become the mainstream of market due to their many superior characteristics such as high space utilization efficiency, low power consumption, radiation-free and low electromagnetic interference.

Nowadays, amorphous silicon thin film transistors (a-Si TFTs) are widely used as switching elements of the liquid crystal display (LCD) devices, but the a-Si TFT LCD devices have limits of meeting the requirements such as thin, light weight, high-finesse, high brightness, high reliability and low power consumption. Compared with the amorphous silicon thin film transistor (a-Si TFT) liquid crystal display (LCD) devices, a low temperature polysilicon (LTPS) thin film transistor (TFT) liquid crystal display (LCD) device has significant advantages on the aspects of satisfying the above requirements.

Firstly, referring to FIG. 1A, a substrate 10 is provided; a polysilicon (LTPS) layer 12 then is formed on the substrate 10, for example, an amorphous silicon (a-Si) layer is formed on the substrate 10 by a sputtering process, an annealing process then is performed so as to make the amorphous silicon layer be recrystallized to form a polysilicon, and finally exposure and development are performed on the polysilicon to form the polysilicon layer 12.

Subsequently, referring to FIG. 1B, an insulating layer 14 is formed overlying the polysilicon layer 12; a gate electrode 16 then is formed on the insulating layer 14; afterwards a photoresist layer 18 is formed on the insulating layer 14, the photoresist layer 18 covers the gate electrode 16 and is located above a middle region of the polysilicon layer 12, for example, a photoresist material is formed on a surface of the insulating layer 14 by spin coating, then exposure and development are performed to remain the photoresist material with a certain thickness covering the gate electrode 16 and being located above the middle region of the polysilicon layer 12 and remove the photoresist material at the other location; after that, an ion implantation process is used to implant ions into regions 122, 124 at two sides of the polysilicon layer 12.

Next, referring to FIG. 1C, the photoresist layer 18 is removed, for example, the photoresist layer 18 is removed by exposure and development; an ion implantation process then is used again to implant ions into regions at two sides of a channel region of the polysilicon layer 12 so that the regions 122, 124 are formed as heavily doped regions and the regions 126, 128 are formed as lightly doped regions, the region 122 and the region 126 constitute a source region, and the region 124 and the region 128 constitute a drain region; next, a passivation layer is formed on the insulating layer 14, the passivation layer covers the insulating layer 14 and the gate electrode 16.

It can be found from the above that, in the conventional LTPS TFT manufacturing process, for the manufacture of the polysilicon layer 12, three times of mask processes and two times of ion implantation processes are needed, the manufacturing process is complex and therefore the cost of manufacturing process is increased and it is adverse to improve productivity.

SUMMARY

In order to solve the above problems in the prior art, an objective of the invention is to provide a manufacturing method of a low temperature polysilicon (LTPS) thin film transistor (TFT). The manufacturing method includes: providing a substrate; forming a buffer layer on the substrate; simultaneously forming a polysilicon layer and a photoresist layer on the buffer layer, wherein the polysilicon layer includes a source region, a drain region and a channel region, a thickness of the photoresist layer located on a portion of the source region far away from the channel region, a thickness of the photoresist layer located on a portion of the source region close to the channel region and a thickness of the photoresist layer located on the channel region are successively increased in that order, a thickness of the photoresist layer located on a portion of the drain region far away from the channel region, a thickness of the photoresist layer located on a portion of the drain region close to the channel region and the thickness of the photoresist layer located on the channel region are successively increased in that order; implanting ions into the source region and the drain region to make the source region and the drain region to form a source electrode and a drain electrode respectively, wherein a portion of the source region far away from the channel region is a source heavily doped region, a portion of the source region close to the channel region is a source lightly doped region, a portion of the drain region far away from the channel region is a drain heavily doped region, and a portion of the drain region close to the channel region is a drain lightly doped region; removing the photoresist layer; forming an insulating layer on the polysilicon layer; forming a gate electrode on the insulating layer; and forming a passivation layer on the insulating layer, wherein the passivation layer is disposed covering the gate electrode.

In an embodiment, simultaneously forming a polysilicon layer and a photoresist layer includes: forming a polysilicon on a surface of the buffer layer, forming a photoresist material on a surface of the polysilicon by spin coating, using a predetermined mask to perform an exposure on the photoresist material, developing the photoresist material after the exposure, remaining the polysilicon and the photoresist material in the region where the polysilicon layer and the photoresist layer are formed and removing the polysilicon and the photoresist material in the other location. A transmittance of a region of the predetermined mask opposing to the channel region, a transmittance of a region of the predetermined mask opposing to the source lightly doped region and a transmittance of a region of the predetermined mask opposing to the source heavily doped region are successively increased in that order, the transmittance of the region of the predetermined mask opposing to the channel region, a transmittance of a region of the predetermined mask opposing to the drain lightly doped region and a transmittance of a region of the predetermined mask opposing to the drain heavily doped region are successively increased in that order.

In an embodiment, simultaneously forming a polysilicon layer and a photoresist layer includes: forming a polysilicon on a surface of the buffer layer, forming a photoresist material on a surface of the polysilicon by spin coating, using a predetermined mask to perform an exposure on the photoresist material, developing the photoresist material after the exposure, remaining the polysilicon and the photoresist in the region where the polysilicon layer and the photoresist layer are formed and removing the polysilicon and the photoresist in the other location. A transmittance of a region of the predetermined mask opposing to the channel region, a transmittance of a region of the predetermined mask opposing to the source lightly doped region and a transmittance of a region of the predetermined mask opposing to the source heavily doped source region are successively decreased in that order, the transmittance of the region of the predetermined mask opposing to the channel region, a transmittance of a region of the predetermined mask opposing to the drain lightly doped region and a transmittance of a region of the predetermined mask opposing to the drain heavily doped region are successively decreased in that order.

In an embodiment, the formation of the polysilicon is that forming an amorphous silicon layer on the surface of the buffer layer by a sputtering process and then recrystallizing the amorphous silicon layer by an annealing process.

In an embodiment, the predetermined mask is a halftone mask or a grayscale mask.

In an embodiment, a material of the photoresist layer is a positive photoresist material.

In an embodiment, a material of the photoresist layer is a negative photoresist material.

In an embodiment, a thickness of the photoresist layer on the source heavily doped region and a thickness of the photoresist layer on the drain heavily doped region are the same, a thickness of the photoresist layer on the source lightly doped region and a thickness of the photoresist layer on the drain lightly doped region are the same.

Sum up, the invention can only use one time of mask process and one time of ion implantation process to complete/finish the manufacturing processing of the polysilicon layer, the manufacturing process can be simplified and therefore the cost of manufacturing cost is reduced and the productivity is improved.

BRIEF DESCRIPTION OF THE DRAWINGS

The above and other aspects, features and advantages of embodiments of the invention will be more apparent from the following detailed description taken in conjunction with the accompanying drawings, in which.

DETAILED DESCRIPTION OF EMBODIMENTS

Figure 1A:
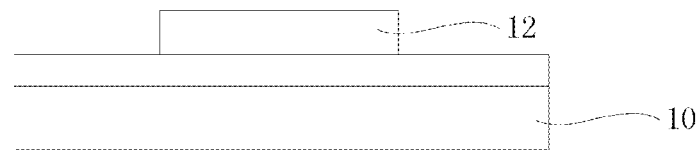
FIG. 1A to FIG. 1C are schematic views of a conventional manufacturing method of a low temperature polysilicon (LTPS) thin film transistor (TFT)
Figure 1B:
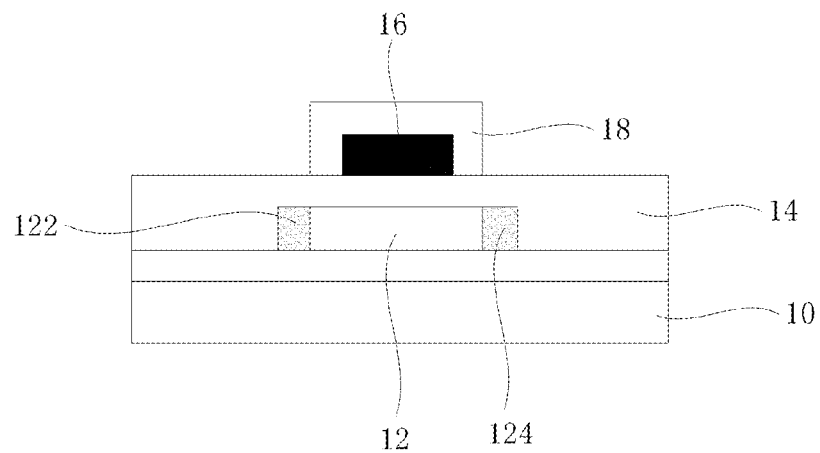
Figure 1C:
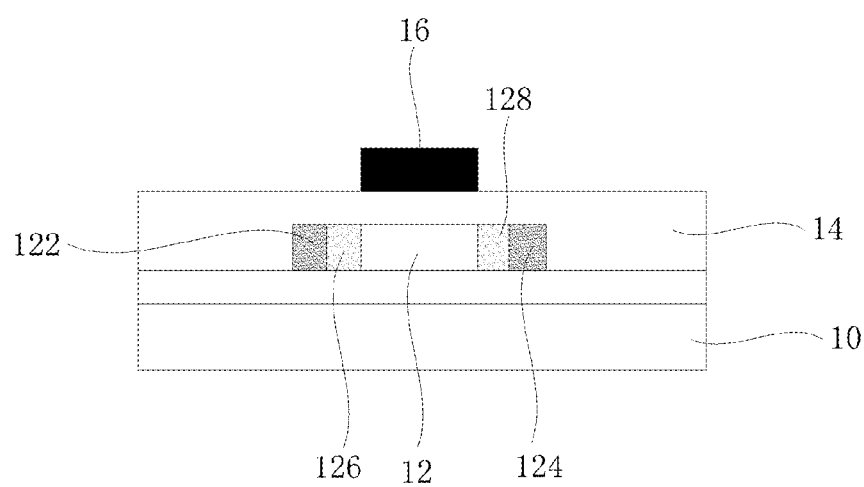

In the following, various embodiments of the invention will be described in detail with reference to accompanying drawings. The invention may be embodied in many different forms and should not be construed as limiting to the embodiments set forth herein. Rather, these embodiments are provided to explain the principles of the invention and its practical applications, so that other skilled in the art can understand various embodiments of the invention and various modifications suitable for specific intended applications. In the drawings, same reference numerals will be used to represent the same components.

FIG. 2A to FIG. 2D are schematic views of a manufacturing method of a low temperature polysilicon (LTPS) thin film transistor (TFT) according to an embodiment of the invention.

Figure 2A:
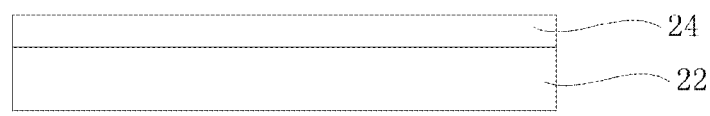
FIG. 2A to FIG. 2D are schematic views of a manufacturing method of a low temperature polysilicon (LTPS) thin film transistor (TFT) according to an embodiment of the invention.

Firstly, referring to FIG. 2A, a substrate 22 is provided, such as an insulating glass substrate or a quartz substrate; next, a buffer layer 24 is formed on the substrate 22, for example, a silicon dioxide ($SiO_2$) is formed on the substrate 22 by a plasma enhanced chemical vapor deposition (PECVD) process.

Figure 2B:
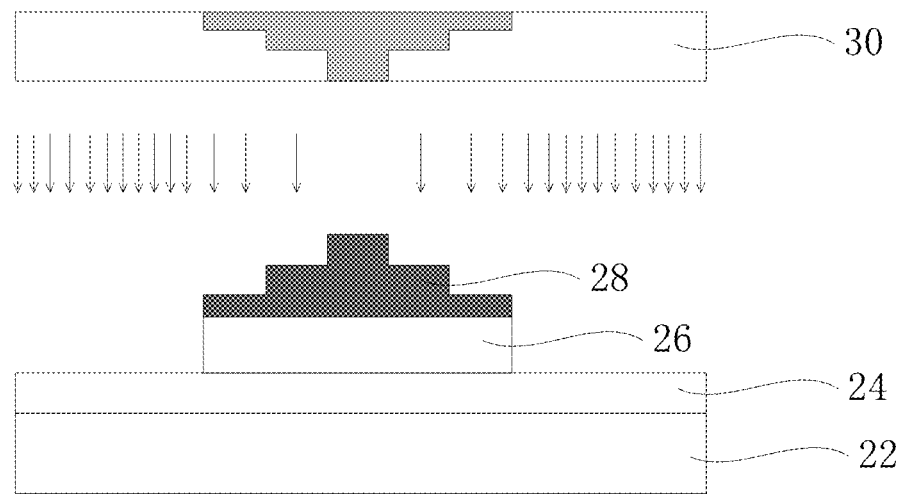

Next, referring to FIG. 2B, a polysilicon layer 26 and a photoresist layer 28 are simultaneously formed on the buffer layer 24. The simultaneous formation of the polysilicon layer 26 and the photoresist layer 28 is that forming a polysilicon on a surface of the buffer layer 24, then forming a photoresist material on a surface of the polysilicon by spin coating, afterwards using a halftone mask 30 to perform an exposure on the photoresist material, and after that developing the photoresist material after the exposure, remaining the polysilicon and the photoresist material in the region where the polysilicon layer 26 and the photoresist layer 28 are formed and removing the polysilicon and the photoresist material located in the other location. The formation of the polysilicon is that forming an amorphous silicon (a-Si) layer on the surface of the buffer layer 24 by a sputtering process and then recrystallizing the amorphous silicon layer by an annealing process.

In the illustrated embodiment, the polysilicon layer 26 includes a source region 262, a drain region 264 and a channel region 266 located therebetween; a thickness of the photoresist layer 28 located right above a portion 2621 of the source region 262 far away from the channel region 266, a thickness of the photoresist layer 28 located right above a portion 2622 of the source region 262 close to the channel region 266 and a thickness of the photoresist layer 28 located right above the channel region 266 are successively increased in that order; a thickness of the photoresist layer 28 located right above a portion 2642 of the drain region 264 far away from the channel region 266, a thickness of the photoresist layer 28 located right above a portion 2641 of the drain region 264 close to the channel region 266, and the thickness of the photoresist layer 28 located right above the channel region 266 are successively increased in that order.

Figure 2C:
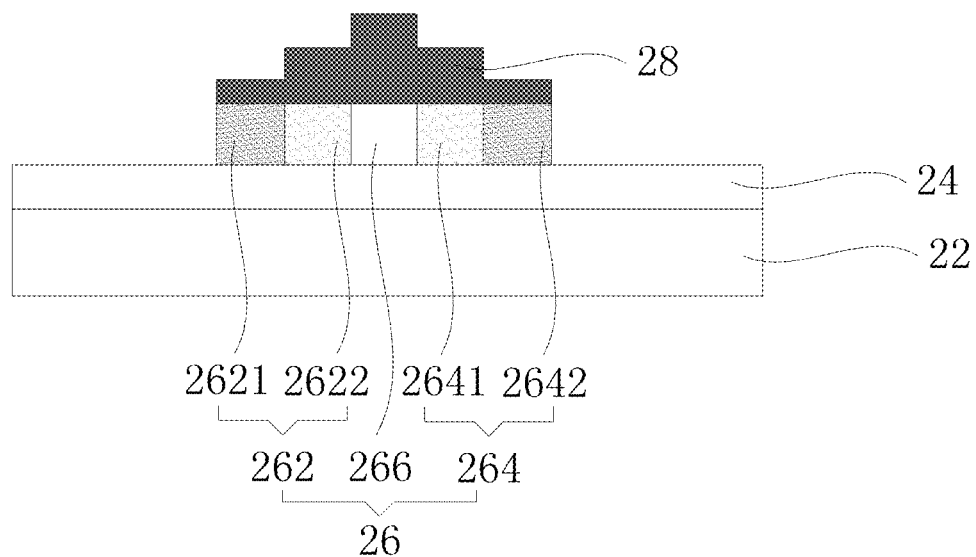

Next, referring to FIG. 2C, the source region 262 and the drain region 264 are implanted with ions in order to make the source region 262 and the drain region 264 form a source electrode and a drain electrode respectively, the portion 2621 of the source region 262 far away from the channel region 266 is a source heavily doped region, the portion 2622 of the source region 262 close to the channel region 266 is a source lightly doped region, the portion 2642 of the drain region 264 far away from the channel region 266 is a drain heavily doped region, and the portion 2641 of the drain region 264 close to the channel region 266 is a drain lightly doped region.

Referring to FIG. 2B and FIG. 2C together, the photoresist layer 28 is formed of a positive photoresist material. In order to make the photoresist layer 28 to form the above structure, correspondingly, a transmittance of a region of the halftone mask 30 opposing to the channel region 266, a transmittance of a region of the halftone mask 30 opposing to the source lightly doped region 2622 and a transmittance of a region of the halftone mask 30 opposing to the source heavily doped region 2621 are successively increased in that order; the transmittance of the region of the halftone mask 30 opposing to the channel region 266, a transmittance of a region of the halftone mask 30 opposing to the drain lightly doped region 2641 and a transmittance of a region of the halftone mask 30 opposing to the drain heavily doped region 2642 are successively increased in that order. The photoresist material is performed with exposure by light transmitted through different regions of the halftone mask 30 and then is developed to form the above photoresist layer 28.

Preferably, the thickness of the photoresist layer 28 located right above the source heavily doped region 2621 and the thickness of the photoresist layer 28 located right above the drain heavily doped region 2642 are the same, the thickness of the photoresist layer 28 located right above the source lightly doped region 2622 and the thickness of the photoresist layer 28 located right above the drain lightly doped region 2641 are the same. Correspondingly, the transmittance of the region of the halftone mask 30 opposing to the source lightly doped region 2622 and the transmittance of the region of the halftone mask 30 opposing to the drain lightly doped region 2641 are the same, the transmittance of the region of the halftone mask 30 opposing to the source heavily doped region 2621 and the transmittance of the region of the halftone mask 30 opposing to the drain heavily doped region 2642 are the same.

Figure 2D:
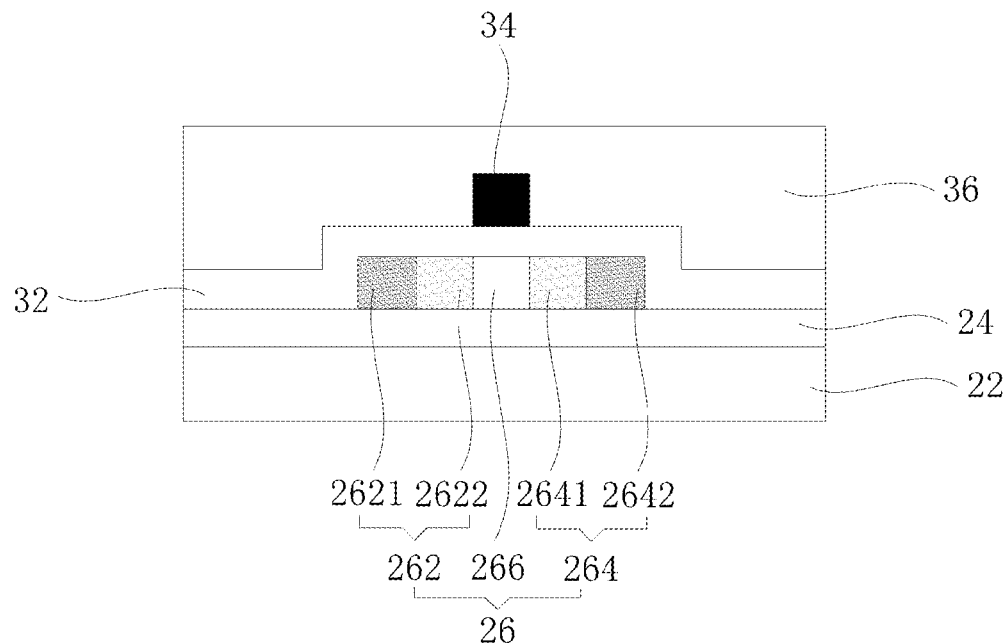

Next, referring to FIG. 2D, the photoresist layer 28 is removed, for example, the photoresist layer 28 is removed by exposure and development; an insulating layer 32 then is formed on the polysilicon layer 26, for example, a silicon dioxide ($SiO_2$) or a silicon nitride ($SiN_x$) is formed on the polysilicon layer 26 by a PECVD process; afterwards, a gate electrode 34 is formed on the insulating layer 32, a material of the gate electrode 34 may be chromium or tungsten or an alloy of both; subsequently, a passivation layer 36 is formed on the insulating layer 32, the passivation layer 36 is disposed covering the gate electrode 34, the passivation layer 36 may for example be a silicon dioxide ($SiO_2$) or a silicon nitride ($SiN_x$) formed on the insulating layer 32 by a PECVD process.

Figure 3B:
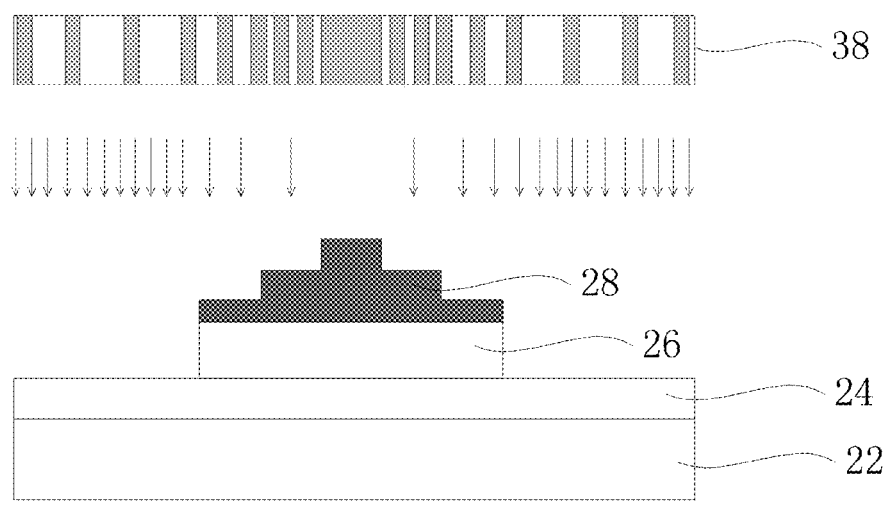
FIG. 3B is a schematic view of simultaneously forming a polysilicon layer and a photoresist layer according to another embodiment of the invention.

FIG. 3B is a schematic view of simultaneously forming a polysilicon layer and a photoresist layer according to another embodiment of the invention.

In the embodiment as shown in FIG. 3B, only the method of simultaneously forming a polysilicon layer and a photoresist layer is different from that of the embodiment as shown in FIG. 2B, the rest is the same and thus will not be repeated.

Referring to FIG. 3B, a polysilicon layer 26 and a photoresist layer 28 is simultaneously formed on the buffer layer 24. The simultaneous formation of the polysilicon layer 26 and the photoresist layer 28 is that forming a polysilicon on a surface of the buffer layer 24, then forming a photoresist material on a surface of the polysilicon by spin coating, afterwards using a grayscale mask 38 to perform an exposure on the photoresist material, then developing the photoresist material after the exposure, remaining the polysilicon and the photoresist material in the region where the polysilicon layer 26 and the photoresist layer 28 are formed and removing the polysilicon and the photoresist material in the other location. The formation of the polysilicon is that forming an amorphous silicon (a-Si) layer on the surface of the buffer layer 24 by a sputtering process and then recrystallizing the amorphous silicon layer by an annealing process.

The photoresist layer 28 is formed of a positive photoresist material. In order to make the photoresist layer 28 to form the above structure, correspondingly, a transmittance (namely slit density) of a region of the grayscale mask 38 opposing to the channel region 266, a transmittance of a region of the grayscale mask 38 opposing to the source lightly doped region 2622 and a transmittance of a region of the grayscale mask 38 opposing to the source heavily doped region 2621 are successively increased in that order; the transmittance of the region of the grayscale mask 38 opposing to the channel region 266, a transmittance of a region of the grayscale mask 38 opposing to the drain lightly doped region 2641 and a transmittance of a region of the grayscale mask 38 opposing to the drain heavily doped region 2642 are successively increased in that order. The photoresist material is performed with exposure by light transmitted through different regions of the grayscale mask 38 and then is developed to form the above photoresist layer 28.

Figure 4B:
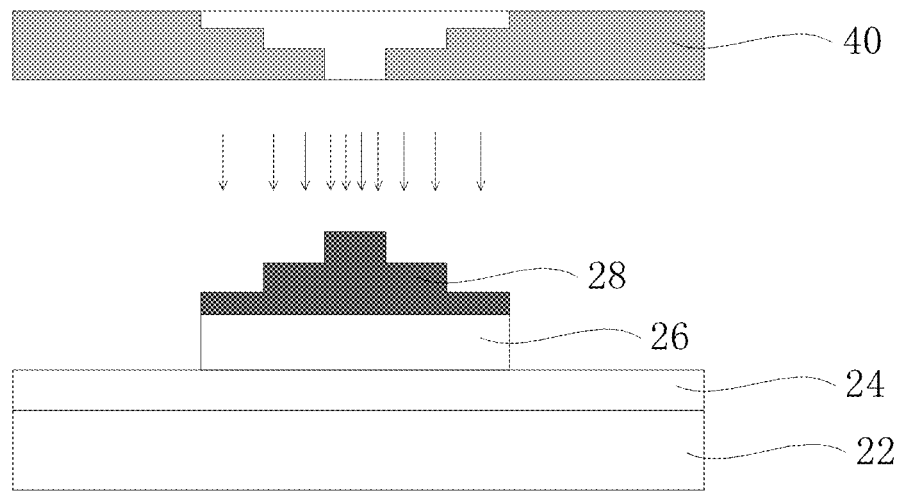
FIG. 4B is a schematic view of simultaneously forming a polysilicon layer and a photoresist layer according to still another embodiment of the invention.

FIG. 4B is a schematic view of simultaneously forming a polysilicon layer and a photoresist layer according to still another embodiment of the invention.

In the embodiment as shown in FIG. 4B, only the method of simultaneously forming of a polysilicon layer and a photoresist layer is different from that of the embodiment as shown in FIG. 2B, the rest is the same and thus will not be repeated.

Referring to FIG. 4B, the photoresist layer 28 is formed of a negative photoresist material. In order to make the photoresist layer 28 to form the above structure, correspondingly, a transmittance of a region of the halftone mask 40 opposing to the channel region 266, a transmittance of a region of the halftone mask 40 opposing to the source lightly doped region 2622 and a transmittance of a region of the halftone mask 40 opposing to the source heavily doped region 2621 are successively decreased in that order; the transmittance of the region of the halftone mask 40 opposing to the channel region 266, a transmittance of a region of the halftone mask 40 opposing to the drain lightly doped region 2641 and a transmittance of a region of the halftone mask 40 opposing to the drain heavily doped region 2642 are successively decreased in that order. The photoresist material is performed with exposure by light transmitted through different regions of the halftone mask 40 and then is developed to form the above photoresist layer 28.

Figure 5B:
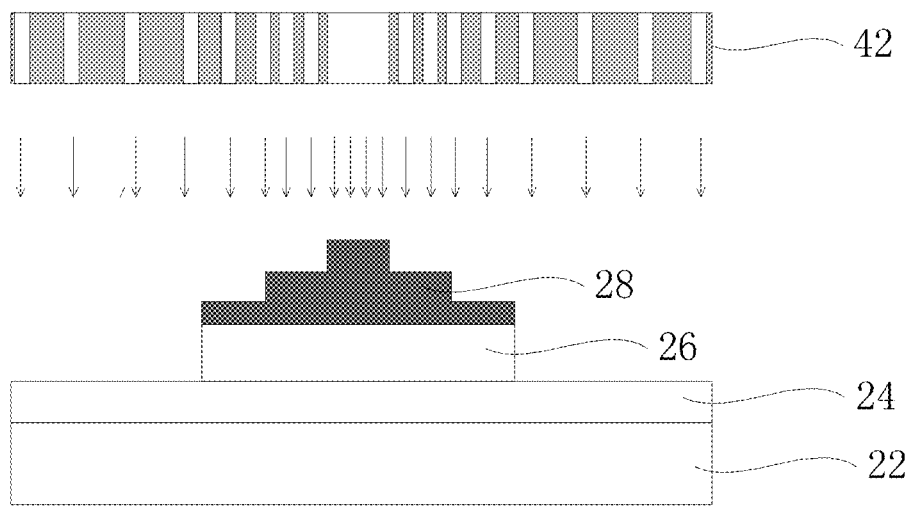
FIG. 5B is a schematic view of simultaneously forming a polysilicon layer and a photoresist layer according to even still another embodiment of the invention.

FIG. 5B is a schematic view of simultaneously forming a polysilicon layer and a photoresist layer according to even still another embodiment of the invention.

In the embodiment as shown in FIG. 5B, only the method of simultaneously forming of a polysilicon layer and a photoresist layer is different from that of the embodiment as shown in FIG. 2B, the rest is the same and thus will not be repeated.

Referring to FIG. 5B, the photoresist layer 28 is formed of a negative photoresist material. In order to make the photoresist layer 28 to form the above structure, correspondingly, a transmittance (slit density) of a region of the grayscale mask 42 opposing to the channel region 266, a transmittance of a region of the grayscale mask 42 opposing to the source lightly doped region 2622 and a transmittance of a region of the grayscale mask 42 opposing to the source heavily doped region 2621 are successively decreased in that order; the transmittance of the region of the grayscale mask 42 opposing to the channel region 266, a transmittance of a region of the grayscale mask 42 opposing to the drain lightly doped drain region 2641 and a transmittance of a region of the grayscale mask 42 opposing to the drain heavily doped region 2642 are successively decreased in that order. The photoresist material is performed with exposure with light transmitted through different regions of the grayscale mask 42 and then is developed to form the above photoresist layer 28.

In summary, the invention can only use one time of mask process and one time of ion implantation process to complete/finish the manufacturing processing of the polysilicon layer, the manufacturing process is simplified, and therefore the cost of manufacturing process is reduced and productivity is improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a low temperature polysilicon thin film transistor, comprising:
   providing a substrate;
   forming a buffer layer on the substrate;
   simultaneously forming a polysilicon layer and a photoresist layer on the buffer layer, wherein the polysilicon layer is a continuous layer located between the buffer layer and the photoresist layer, the polysilicon layer comprises a source region, a drain region and a channel region located therebetween, the photoresist layer has a continuous stepwise shape; a thickness of the photoresist layer located on a portion of the source region far away from the channel region, a thickness of the photoresist layer located on a portion of the source region close to the channel region and a thickness of the photoresist layer located on the channel region are different from one another and successively increased in that order; a thickness of the photoresist layer located on a portion of the drain region far away from the channel region, a thickness of the photoresist layer located on a portion of the drain region close to the channel region and the thickness of the photoresist layer located on the channel region are different from one another and successively increased in that order;
   implanting ions through the photoresist layer into the source region and the drain region to make the source region and the drain region to form a source electrode and a drain electrode respectively, wherein the portion of the source region far away from the channel region is a source heavily doped region, the portion of the source region close to the channel region is a source lightly doped region, the portion of the drain region far away from the channel region is a drain heavily doped region, the portion of the drain region close to the channel region is a drain lightly doped region;
   removing the photoresist layer after the implanting;
   forming an insulating layer on the polysilicon layer;
   forming a gate electrode on the insulating layer;
   forming a passivation layer on the insulating layer, wherein the passivation layer is disposed covering the gate electrode.

2. The manufacturing method according to claim 1, wherein simultaneously forming a polysilicon layer and a photoresist layer comprises: forming a polysilicon on a surface of the buffer layer, forming a photoresist material on a surface of the polysilicon by spin coating, using a predetermined mask to perform an exposure on the photoresist material, developing the photoresist material after the exposure, remaining the polysilicon and the photoresist material in the region where the polysilicon layer and the photoresist layer are formed and removing the polysilicon and the photoresist material in the other location,
   wherein a transmittance of a region of the predetermined mask opposing to the channel region, a transmittance of a region of the predetermined mask opposing to the source lightly doped region and a transmittance of a region of the predetermined mask opposing to the source heavily doped region are successively increased in that order; the transmittance of the region of the predetermined mask opposing to the channel region, a transmittance of a region of the predetermined mask opposing to the drain lightly doped region and a transmittance of a region of the predetermined mask opposing to the drain heavily doped region are successively increased in that order.

3. The manufacturing method according to claim 1, wherein simultaneously forming a polysilicon layer and a photoresist layer comprises: forming a polysilicon on a surface of the buffer layer, forming a photoresist material on a surface of the polysilicon by spin coating, using a predetermined mask to perform an exposure on the photoresist material, developing the photoresist material after exposure, remaining the polysilicon and the photoresist material in the region where the polysilicon layer and the photoresist layer are formed and removing the polysilicon and the photoresist material in the other location,
   wherein a transmittance of a region of the predetermined mask opposing to the channel region, a transmittance of a region of the predetermined mask opposing to the source lightly doped region and a transmittance of a region of the predetermined mask opposing to the source heavily doped region are successively decreased in that order; the transmittance of the region of the predetermined mask opposing to the channel region, a transmittance of a region of the predetermined mask opposing to the drain lightly doped region and a transmittance of a region of the predetermined mask opposing to the drain heavily doped region are successively decreased in that order.

4. The manufacturing method according to claim 2, wherein the formation of the polysilicon is that forming an amorphous silicon layer on the surface of the buffer layer by a sputtering process and then recrystallizing the amorphous silicon layer by an annealing process.

5. The manufacturing method according to claim 2, wherein the predetermined mask is a halftone mask or a grayscale mask.

6. The manufacturing method according to claim 4, wherein the predetermined mask is a halftone mask or a grayscale mask.

7. The manufacturing method according to claim 3, wherein the formation of the polysilicon is that forming an amorphous silicon layer on the surface of the buffer layer by a sputtering process and then recrystallizing the amorphous silicon layer by an annealing process.

8. The manufacturing method according to claim 3, wherein the predetermined mask is a halftone mask or a grayscale mask.

9. The manufacturing method according to claim 7, wherein the predetermined mask is a halftone mask or a grayscale mask.

10. The manufacturing method according to claim 5, wherein a material of the photoresist layer is a positive photoresist material.

11. The manufacturing method according to claim 6, wherein a material of the photoresist layer is a positive photoresist material.

12. The manufacturing method according to claim 8, wherein a material of the photoresist layer is a negative photoresist material.

13. The manufacturing method according to claim 9, wherein a material of the photoresist layer is a negative photoresist material.

14. The manufacturing method according to claim 1, wherein a thickness of the photoresist layer on the source heavily doped region and a thickness of the photoresist layer on the drain heavily doped region are the same, a thickness of the photoresist layer on the source lightly doped region and a thickness of the photoresist layer on the drain lightly doped region are the same, and thereby the photoresist layer having the continuous stepwise shape has three different thicknesses.

* * * * *